(12) United States Patent
Fasching

(10) Patent No.: US 12,484,321 B2
(45) Date of Patent: Nov. 25, 2025

(54) CMOS COMPATIBLE NEAR-INFRARED SENSOR SYSTEM

(71) Applicant: AMS INTERNATIONAL AG, Jona (CH)

(72) Inventor: Gernot Fasching, Eindhoven (NL)

(73) Assignee: ams International AG, Jona (CH)

( * ) Notice: Subject to any disclaimer, the term of this patent is extended or adjusted under 35 U.S.C. 154(b) by 689 days.

(21) Appl. No.: 17/787,319

(22) PCT Filed: Dec. 15, 2020

(86) PCT No.: PCT/EP2020/086305
§ 371 (c)(1),
(2) Date: Jun. 19, 2022

(87) PCT Pub. No.: WO2021/122657
PCT Pub. Date: Jun. 24, 2021

(65) Prior Publication Data
US 2023/0014361 A1    Jan. 19, 2023

Related U.S. Application Data

(60) Provisional application No. 62/951,247, filed on Dec. 20, 2019.

(51) Int. Cl.
*H01L 21/78*      (2006.01)
*H10F 30/227*     (2025.01)
(Continued)

(52) U.S. Cl.
CPC ......... *H10F 39/184* (2025.01); *H10F 30/227* (2025.01); *H10F 39/803* (2025.01)

(58) Field of Classification Search
CPC ......... H01L 27/14649; H01L 27/14609; H01L 31/108; H01L 27/1443; H01L 31/02019;
(Continued)

(56) References Cited

U.S. PATENT DOCUMENTS 4,204,938 A * 5/1980 Bachot .................. C25B 13/04
                                                   264/46.7
4,868,843 A * 9/1989 Nunan .................. G21K 1/046
                                                   378/65
(Continued)

FOREIGN PATENT DOCUMENTS

CN    101090126 A    12/2007
CN    106784121 A     5/2017
(Continued)

OTHER PUBLICATIONS

First Search of corresponding Chinese Patent Application No. 202080081329.9, dated Jun. 26, 2024, 1 page (for informational purposes only).
(Continued)

*Primary Examiner* — Vu A Vu
(74) *Attorney, Agent, or Firm* — Viering, Jentschura & Partner mbB

(57) ABSTRACT

A surface plasmon-based photodetector includes: a silicon substrate; a grating in contact with a surface of the silicon substrate, in which the grating forms a Schottky diode with the semiconductor substrate; and a complementary-metal-oxide-semiconductor (CMOS) sample and hold stage as well as an analog-to-digital circuit (ADC) in the silicon substrate and arranged to detect electrical current generated at the Schottky diode.

12 Claims, 6 Drawing Sheets

(51) Int. Cl.
*H10F 39/00* (2025.01)
*H10F 39/18* (2025.01)

(58) Field of Classification Search
CPC ....... H01L 31/022408; H01L 31/02327; G11C 27/026; H03F 2203/45514; H03F 2203/45551; H03F 3/087; H03F 3/45183; H03F 3/45237; H03F 3/45381; H03F 3/45434; H03F 3/45475
USPC .......................................................... 438/69
See application file for complete search history.

(56) References Cited

U.S. PATENT DOCUMENTS

| | | | | |
|---|---|---|---|---|
| 7,084,974 | B1 * | 8/2006 | Barwicz | G01J 3/28 |
| | | | | 356/328 |
| 7,329,871 | B2 * | 2/2008 | Fan | G01J 5/0837 |
| | | | | 250/353 |
| 7,446,875 | B2 * | 11/2008 | Wake | A61B 5/0059 |
| | | | | 356/432 |
| 7,460,224 | B2 * | 12/2008 | Wang | G01N 21/648 |
| | | | | 356/301 |
| 8,188,438 | B2 * | 5/2012 | Li | B01L 3/502761 |
| | | | | 250/364 |
| 8,829,455 | B2 * | 9/2014 | Nakatsugawa | A61B 6/4233 |
| | | | | 250/370.09 |
| 8,948,562 | B2 * | 2/2015 | Norris | G02B 5/008 |
| | | | | 257/E31.093 |
| 9,041,579 | B2 * | 5/2015 | Meynants | H03M 1/34 |
| | | | | 341/169 |
| 9,093,573 | B2 * | 7/2015 | Wang | H04N 25/00 |
| 10,403,781 | B1 | 9/2019 | Munday | |
| 10,408,673 | B2 * | 9/2019 | Brueck | G01J 3/2803 |
| 10,739,201 | B2 * | 8/2020 | Schieferdecker | H04N 25/76 |
| 10,886,312 | B2 * | 1/2021 | Na | H01L 27/14636 |
| 11,462,656 | B2 * | 10/2022 | Wang | H01L 31/02327 |
| 11,688,820 | B2 * | 6/2023 | Oh | G01J 5/20 |
| | | | | 257/457 |
| 11,876,141 | B2 * | 1/2024 | Shimatani | H01L 27/14643 |
| 2004/0101007 | A1 | 5/2004 | Bozso et al. | |
| 2007/0235635 | A1 | 10/2007 | Arend et al. | |
| 2012/0256192 | A1 * | 10/2012 | Zhang | H01L 29/6606 |
| | | | | 257/481 |
| 2015/0228837 | A1 | 8/2015 | Chen | |
| 2017/0005622 | A1 | 1/2017 | Fitzi | |
| 2017/0219434 | A1 | 8/2017 | Udrea et al. | |
| 2018/0102491 | A1 * | 4/2018 | Hou | H10K 30/87 |

FOREIGN PATENT DOCUMENTS

| | | |
|---|---|---|
| CN | 108885137 A | 11/2018 |
| WO | 2005/092037 A2 | 10/2005 |
| WO | 2015/078611 A1 | 6/2015 |

OTHER PUBLICATIONS

Yan Mei et al: "A novel CMOS digital pixel sensor for ID barcode scanning", Proceedings of SPIE, vol. 5301, Jun. 7, 2004 (Jun. 7, 2004), pp. 213-221, XP055801512, Orlando, Florida, ISSN: 0277-786X, DOI: 10.1117/12.526736 ISBN: 978-1-5106-4059-7 Retrieved from the Internet: URL:http://dx.doi.org/10.1117/12.526736> the whole document.

Masanori Furuta et al: "A High-Speed, ~High-Sensitivity Digital CMOS Image Sensor With a Global Shutter and 12-bit col. Parallel Cyclic A/D Converters", IEEE Journal of Solid-State Circuits, IEEE, USA, vol. 42, No. 4, Apr. 1, 2007 (Apr. 1, 2007), pp. 766-774, XP011175856, ISSN: 0018-9200, DOI: 10.1109/JSSC.2007. 891655, pp. 766-767, section III, first paragraph figures 1-4, 11.

Robert J et al: "A second-order high-resolution incremental A/D converter with offset and charge injection compensation", IEEE Journal of Solid-State Circuits, IEEE, USA, vol. 23, No. 3, Jun. 1, 1988 (Jun. 1, 1988), pp. 736-741, XP011479178, ISSN: 0018-9200, DOI: 10.1109/4.313, cited in the application, figures 3 .7.

International Search Report and Written Opinion for corresponding PCT Patent Application No. PCT/EP2020/086305 dated May 10, 2021.

* cited by examiner

CMOS COMPATIBLE NEAR-INFRARED SENSOR SYSTEM

RELATED APPLICATIONS

The present invention is a U.S. National Stage under 35 USC 371 patent application, claiming priority to Serial No. PCT/EP2020/086305, filed on Dec. 15, 2020, which claims priority from U.S. Provisional Application No. 62/951,247, filed Dec. 20, 2019; the entireties of both are hereby incorporated herein by reference.

TECHNICAL FIELD

The present disclosure relates to CMOS compatible near-infrared sensors.

BACKGROUND

Near-infrared detectors include photodetectors that are capable of detecting light in the near-infrared region of the electromagnetic spectrum, e.g., from about 800 nm to about 2500 nm.

SUMMARY

The present disclosure relates to CMOS compatible near-infrared sensors.

In general, in some aspects, the subject matter of the present disclosure is embodied in surface plasmon-based photodetectors that include: a silicon substrate; a grating in contact with a surface of the silicon substrate, in which the grating forms a Schottky diode with the semiconductor substrate; a complementary-metal-oxide-semiconductor (CMOS) based sample and hold circuitry to translate the photodiode current into an analog voltage. This is followed by a CMOS based analog-to-digital circuit (ADC) in the silicon substrate and arranged to translate the analog voltage into a digital output value representing the measured photodiode current.

Implementations of the photodetector can include one or more of the following features. For example, in some implementations, the grating is aluminum, platinum or gold. Or the grating is made of another metal with a similar workfunction as the before mentioned metals. An intervening layer such as a Ti metal layer may be formed between the grating and the silicon surface. A thickness of the intervening layer may be in the range of few nanometers In some implementations, the grating includes multiple rings.

In some implementations, the grating includes multiple pillars arranged in a two-dimensional array.

In some implementations, the CMOS sample and hold and ADC is laterally displaced from the grating without being positioned directly underneath the grating.

In some implementations, the CMOS sample and hold and ADC is no more than 1 micron away from an edge of the grating.

In some implementations, the sample and hold circuit may include multiple amplifier circuits. The multiple amplifier circuits may include differential amplifier circuits. Each differential amplifier circuit may include multiple differential stages.

In some implementations, the CMOS ADC comprises a sigma-delta A-to-D converter.

The details of one or more embodiments are set forth in the accompanying drawings and the description below.

Other features and advantages will be apparent from the description, drawings, and claims.

DETAILED DESCRIPTION

Although silicon based photodetectors are useful for wavelengths of light generally in the visible range, silicon is primarily transparent to light having wavelengths above about 1100 nm. Materials that are used for infrared detectors, such as III-V materials including InGaAs or SiGe, are limited in use to due lattice mismatch. This constrains the achievable detector absorption coefficient, and thus the spectral coverage of the detector. Furthermore, non-silicon based infrared detectors are not easily compatible or integrated with CMOS-based readout circuits.

The present disclosure relates to a CMOS compatible near-infrared sensor that provides wide spectral responsivity in the near-infrared, as well as integration with CMOS-based readout technology. The CMOS compatible sensor employs the use of surface plasmons to generate hot electron carriers, which, in turn, can be detected with integrated CMOS readout technology. The combination of hot carrier generation by surface plasmon detection with CMOS circuitry allows the fabrication of a fully integrated near-infrared detector system. In particular, in some implementations, the surface plasmon detection circuitry is formed using materials such as aluminum, platinum, among other materials, that can be employed in CMOS-compatible fabrication environments without concern about adverse effects caused by metal diffusion or migration. However, also other metals like gold could be used for the top grating in a back-end line separated from the wafer front-end processing. Furthermore, in some implementations, the sensor systems disclosed herein incorporate CMOS readout circuitry that is capable of detecting and amplifying very low electron counts, and avoids the use of non-integrated signal detection and amplification devices, such as lock-in amplifiers.

Figure 1:
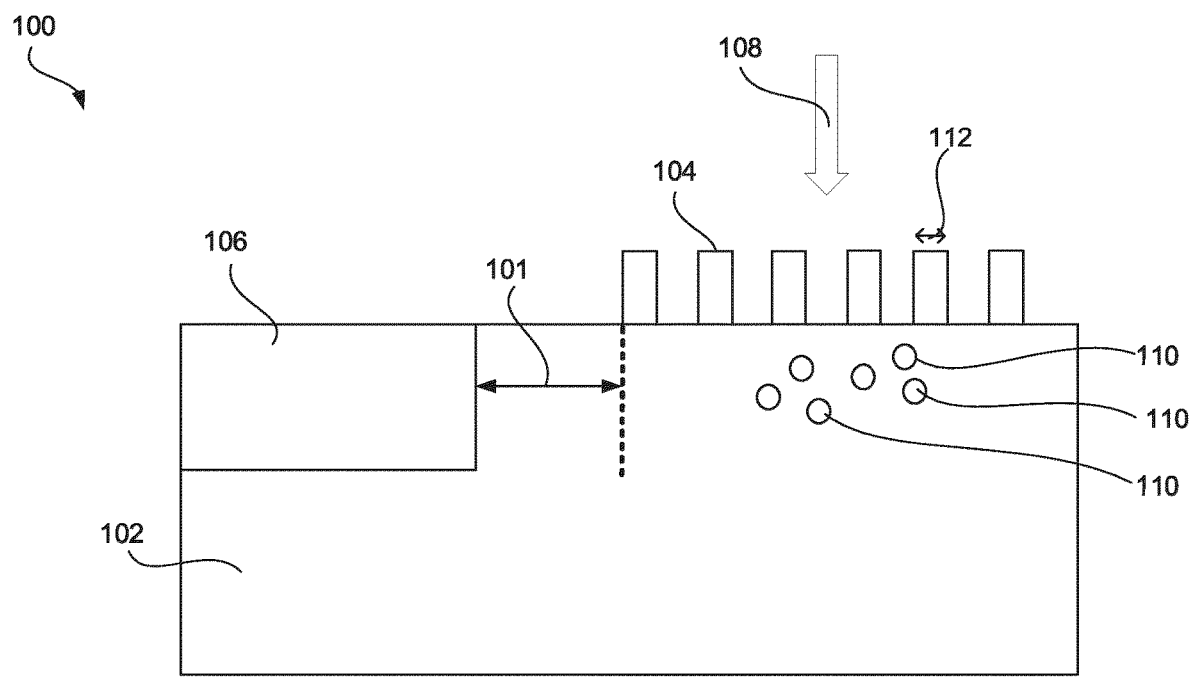
FIG. 1 is a schematic illustrating an exemplary CMOS based near-infrared detector.

FIG. 1 is a schematic illustrating an exemplary CMOS based near-infrared detector 100. Detector 100 includes a semiconductor substrate 102, a grating structure 104 on a surface of the semiconductor substrate 102, a sample and hold circuit in combination with an analog-to-digital (AD) circuit 106 formed in the substrate 102. The semiconductor substrate 102 may be formed from, e.g., single-crystalline silicon wafer or a silicon-on-insulator substrate. The grating structure 104 includes, e.g., a thin-film periodic grating structure formed of multiple gratings. The gratings in the example of FIG. 1 are presented as 1D elongated gratings (i.e., extending into and out of the page), but other grating shapes may be used instead. The grating structure 104 may be formed from various materials including, e.g., aluminum, platinum, gold or other metals with a similar workfunction.

Between these metals forming the grating and the silicon surface there also may be a thin titanium layer as adhesion between the metal grating and the silicon surface. The grating structure 104 may be a thin-film structure in which the thickness of the grating material (where the thickness corresponds to the height of the grating material relative to a surface of the substrate on which the grating is formed) is greater than a few nanometers and less than about 1 micron, e.g., between 100 and 500 nm. The sample and hold and AD circuits 106 includes CMOS-based (e.g. NMOS and/or PMOS) detection circuitry for detecting electrons generated within the substrate by surface plasmons and converting the photocurrent into a digital output value. The sample and hold circuit 106 may further include amplifier circuitry to amplify the photocurrent. Further details on the sample and hold and the AD circuit 106 are disclosed below. The sample and hold and the AD circuit 106 may be laterally spaced apart from the grating structure 104. That is, the circuit 106 is laterally separated from a far edge of the grating structure 104 by a distance 101 so that the circuit 106 is not located underneath the grating. The lateral distance 101 may be in a range of several nanometers to several microns including, e.g., greater than 2 nm, greater than 5 nm, greater than 10 nm, greater than 25 nm, greater than 50 nm, greater than 100 nm, greater than 200 nm, or greater than 400 nm but less than 3 microns, less than 2 microns less than 1 micron, less than 900 nm, less than 750 nm, less than 600 nm, less than 500 nm, less than 400 nm, less than 250 nm, less than 100 nm, less than 50 nm, less than 25 nm, or less than 10 nm.

During operation of the device 100, light 108 in the infrared wavelength range (e.g., between about 800 nm and about 2500 nm) is incident on the grating structure 104. The incident light 108 enables the formation of surface plasmon waves capable of propagating on the surface of the grating structure 104. In addition to propagating along the surface of the grating structure 104, plasmons can also propagate through the gaps between the gratings. These surface plasmons induce the generation of hot electrons 110 within the semiconductor substrate 102, which, in turn, produces a photocurrent to develop within the substrate. By adjusting the width 112 of each grating of the grating structure 104, and thus the distance between the gaps between the gratings, it is even possible to tune the peak responsivity of the device 100 to different wavelengths within the infrared wavelength band.

Figure 2:
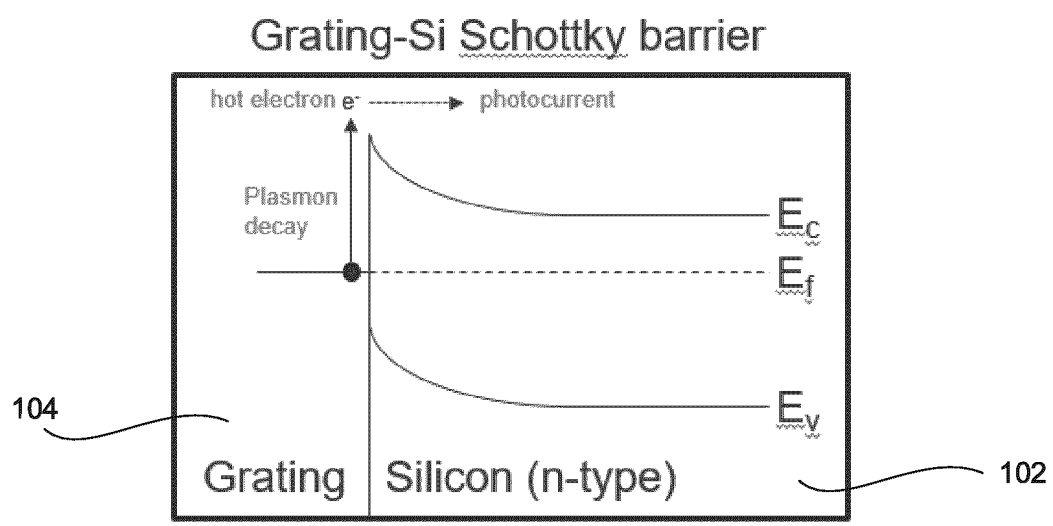
FIG. 2 is a schematic depicting an exemplary Schottky barrier.

The grating structure 104 forms a Schottky barrier with the underlying substrate 102. FIG. 2 is a schematic depicting an exemplary Schottky barrier formed with a Si substrate. The energy barrier of the grating structure 104 is represented by a metal. The substrate 102 is presumed to be an n-type Si substrate, though p-type materials may be used instead. $E_C$, $E_F$, and $E_V$ represent the conduction band energy level, the Fermi energy level, and the valence band energy level of the semiconductor 102. $Phi_B$ represents the bias potential at the interface between the grating 104 and the semiconductor 102. The magnitude of the bias potential depends on the selection of materials used to form the grating structure 104 and the semiconductor selected as the substrate 102. A minimum bias offset may be required to keep dark current generation low enough so as not to interfere with measurements of hot electrons generated by the decaying plasmons. As shown in FIG. 2, when a surface plasmon induced by the incident light decays, the surface plasmon generates a hot electron with sufficient energy to cross the Schottky barrier into the semiconductor 102.

As explained herein, various materials may be used to form the gratings of the grating structures. For instance, in some implementations, the gratings may be formed using gold. The photocurrent levels generated with gold as the material for the grating structure 104 can be relatively high. However, gold would need to be used in a back-end processing line separated from the front-end processing to prevent gold cross-contamination due to its high diffusion which may be detrimental to CMOS fab environments. As an alternative to gold, other materials, such as aluminum, platinum, or metals with a similar workfunction may be used to form the grating structure. However, in certain implementations, the photocurrent levels that can be generated in devices that use these materials tends to be rather low, making it susceptible to noise and need a high signal amplification which makes it crucial to use a sophisticated integrated sample and hold and AD converter circuitry.

To address the low photocurrent levels that may arise, the sample and hold as well as the AD circuit 106 may be designed to have a high photocurrent sensitivity, resolution and high accuracy. For instance, the circuit 106 may be capable of measuring currents with sub-nano ampere or sub-pico ampere resolution. In general, it is very difficult to provide such high resolution and accurate detection by coupling the substrate to an off-the-shelf amplifier, such as through the use of an externally coupled lock-in amplifier, since the noise levels may be too high and the signal levels too low. To solve this concern, the circuit 106 is integrated within the substrate 102 close to the grating structure 104 itself. That is, the circuit 106 may be a CMOS compatible circuit design. Furthermore, the circuit 106 may be additionally designed for detecting very small photocurrents.

Figure 3:
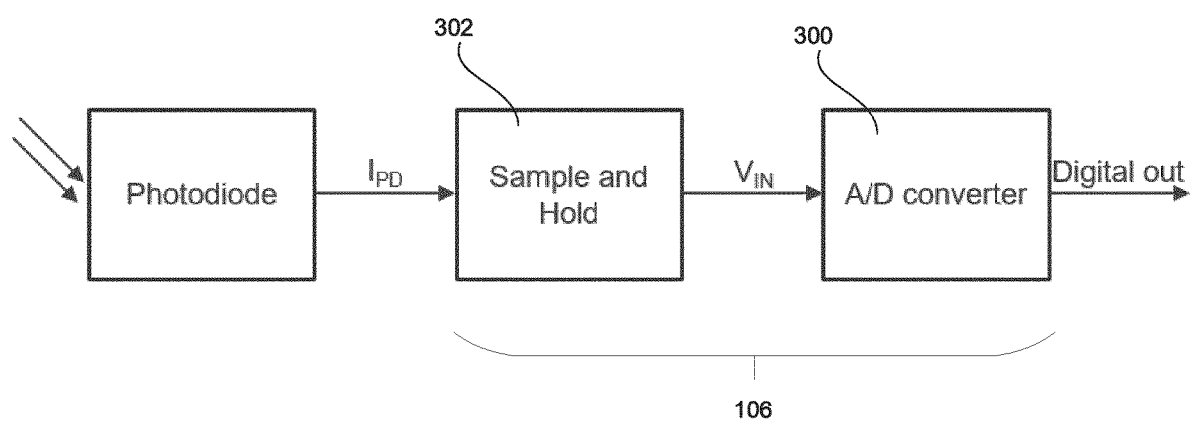
FIG. 3 is a schematic that illustrates an exemplary analog-to-digital converter circuit.

FIG. 3 is a schematic that illustrates a block diagram of an exemplary circuit 106 that is coupled to the output of a photodetector 301 to receive a photocurrent $I_{PD}$ from the photodetector 301. The photodetector 301 may be a CMOS based near-infrared detector 100 as described herein. The circuit 106 may be CMOS fabrication compatible and can be integrated with the semiconductor substrate 102 to provide a conversion of the detected photocurrent $I_{PD}$ into a proportional voltage (by a sample and hold circuit) and subsequent analog-to-digital conversion for low photocurrents and which introduces little noise. The circuit 106 shown in FIG. 3 includes a high resolution AD converter circuit 300 and a sample and hold circuitry 302. The high resolution AD converter circuit 300 may be, e.g., a second (or higher) order incremental AD converter circuit. For instance, the second (or higher) order incremental AD converter circuit 300 may be based on sigma-delta modulation. For instance, the AD converter circuit 300 may be capable of achieving 12 bit, 13 bit, 14 bit, 15 bit, or 16-bit accuracy. The sample and hold circuit 302 is a low noise converter circuit. For instance, the amplifier of the sample and hold circuit 302 may exhibit noise levels as low as several picoamperes, or even sub-picoampere levels.

Figure 4A:
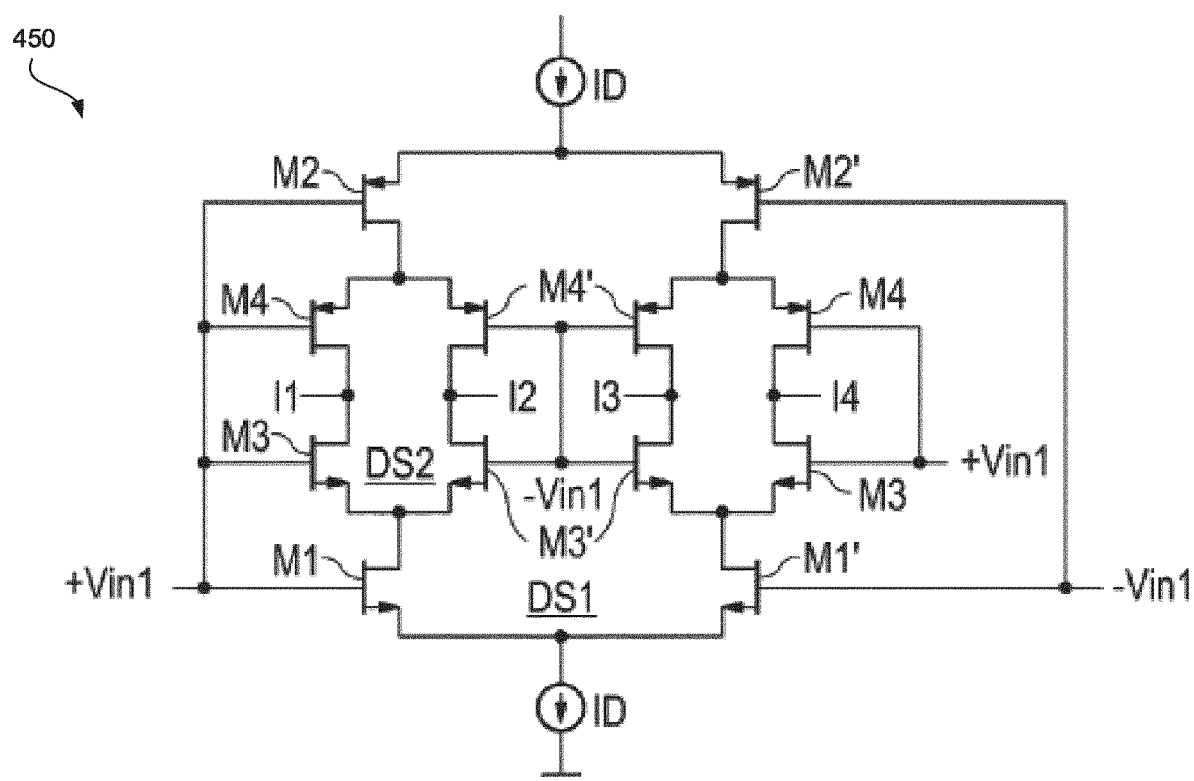
FIG. 4A is a schematic that illustrates an exemplary differential amplifier circuit.

The amplifier of the sample and hold circuit 302 may further include one or more differential amplifier circuits, as shown in FIG. 4A, which may be configured to enhance the noise performance of the sample and hold circuit 106.

As explained above, the amplifiers of the sample and hold circuit 302 may include of one or more differential amplifier stages, to perform the photocurrent amplification and conversion into a voltage signal with lower noise and to improve the conversion accuracy with less non-linearity.

FIG. 4A is a schematic that illustrates an exemplary differential amplifier circuit 450 that may be used as amplifier in the sample and hold circuit. The differential amplifier circuit 450 may be formed using CMOS fabrication techniques. The amplifier circuit 450 includes a first differential stage DS1 and a second differential stage DS2. The first differential stage DS1 includes MOS transistors M1, M1', the source nodes of which are directly connected together and, through a current source ID, to ground potential. The current source ID supplies the drain current for the two transistors M1, M1'. Each transistor M1, M1' has a control input, namely in this case the respective gate terminal. The two gate terminals of the respective transistors of the first differential stage are forming a differential input, at which a differential input signal +VIN1, −VIN1 can be supplied. The amplifier circuit 450 also includes a second differential stage DS2 having two transistor pairs. Each transistor pair includes two transistors M3, M3' forming a respective differential pair. Each differential pair including the two transistors M3, M3' has their source nodes connected directly together and to a drain terminal of a respective transistor M1, M1' of the first differential stage to constitute a cascade of differential pairs. Each differential pair of the second differential stage has a differential input formed at gate terminals of the respective transistors M3, M3'. On the input side, the differential pairs of the second differential stage D2 are connected in parallel to the common differential input of the amplifier arrangement. Therefore, all three differential pairs of the two differential stages are connected in parallel on their input side. Further details of the configuration and operation of amplifier circuit 450 can be found, e.g., in WO2015/078611A1, which is incorporated herein by reference in its entirety. The amplifier circuit design shown in FIG. 4A allows, in some implementations, lower noise without increased power consumption. Furthermore, the amplifier circuit design 450 of FIG. 4A exhibits a substantially linear response, which, together with the low noise operation, allows an improvement in signal accuracy.

Figure 4B:
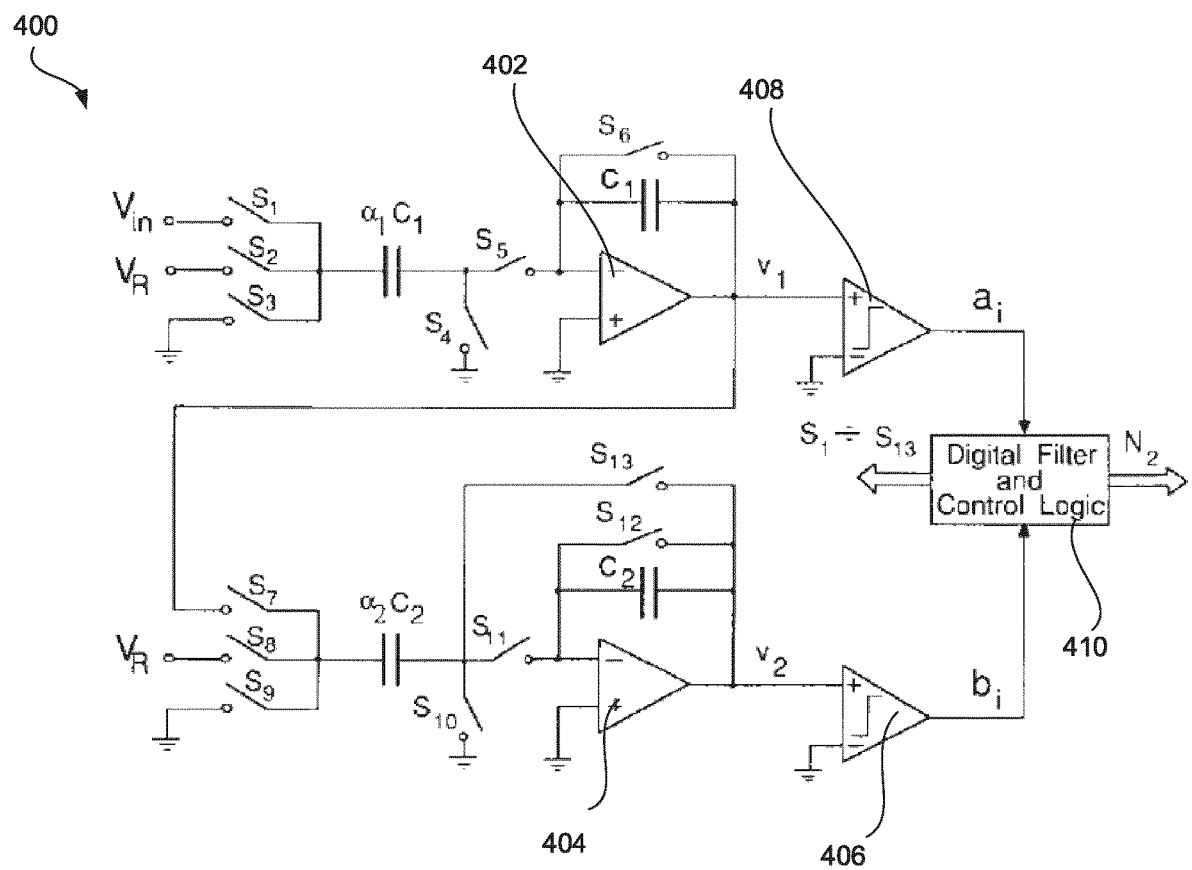
FIG. 4B is a schematic that illustrates an exemplary second order AD converter circuit.

FIG. 4B is a schematic that illustrates an exemplary second order AD converter circuit 400 that may be used as the AD converter circuit 300 of FIG. 3. The AD converter circuit 400 is a type of second-order sigma-delta modulator A-to-D converter, also referred to as a multistage sigma-delta A-to-D converter that can be fabricated using standard CMOS processing. Vin represents the input voltage, which may be obtained by converting the hot electron photocurrent to a voltage signal using the sample and hold circuit 106. VR represents a reference voltage. S1 through S13 are switches that can be open or closed during operation of the AD converter circuit. The exemplary circuit 400 further includes four amplifiers 402, 404, 406, 408 and a digital filter and control logic block 410 that is coupled to the amplifiers 406, 408 to receive the outputs of those amplifiers and to provide digital processing of the comparator outputs. The AD converter circuit 400 further may include multiple capacitors C1 and C2. N2 represents the converter output code in digital form. The second-order incremental A/D converter 400, which makes use of sigma-delta modulation associated with a simple digital filter, is capable of achieving high resolution and high signal-to-noise. Further details on the construction and operation of a second (or higher) order incremental AD converter circuits, such as circuit 400 may be found, e.g., in "A Second-Order High-Resolution Incremental A/D Converter with Offset and Charge Injection Compensation," by J. Robert and P. Deval, IEEE JOURNAL OF SOLID-STATE CIRCUITS, VOL 23. NO 3, JUNE 1988, which is incorporated herein by reference in its entirety.

Figure 5A:
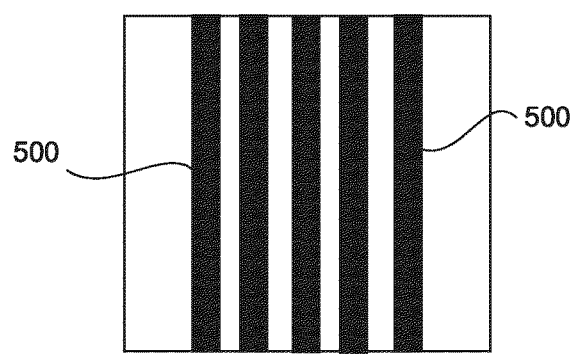
FIG. 5A-5C are schematics depicting exemplary grating structures.
Figure 5B:
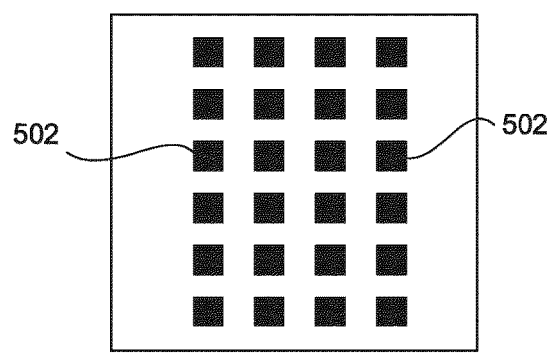
Figure 5C:
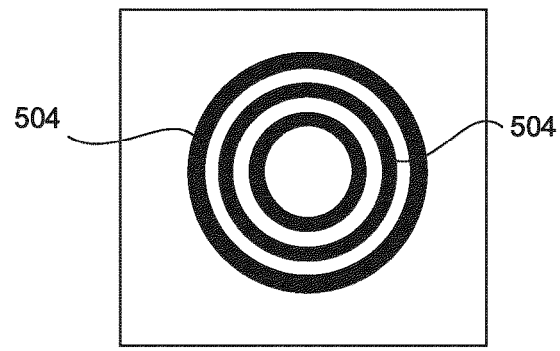

As explained above, the gratings 104 of the detector may be formed to have various different shapes. FIGS. 5A-5C are schematics that depict different exemplary geometric arrangements that can be used for the gratings of the near-IR detector disclosed herein. For instance, FIG. 5A shows a top view in which the gratings are 1D gratings 500. Specifically, the gratings 500 in FIG. 5A include a periodic array of elongated thin-film metal lines separated by equally spaced gaps. FIG. 5B shows a top view in which the diffraction grating includes a 2D array of thin-film pillars. The pillars 502 may have various shapes including, e.g., square, triangular, circular, among others. The pillars 502 may be separated from adjacent pillars 502 in the array by corresponding gaps. FIG. 5C shows a top view in which the diffraction grating includes a concentric array of thin-film circular elements. Each circle within the concentric array may be separated from an adjacent circle by a corresponding gap.

A number of embodiments of the invention have been described. Nevertheless, it will be understood that various modifications may be made without departing from the spirit and scope of the invention. Accordingly, other embodiments are within the scope of the following claims.

The invention claimed is:

1. A surface plasmon-based photodetector comprising:
   a silicon substrate;
   a grating in contact with a surface of the silicon substrate, wherein the grating forms a Schottky diode with the silicon substrate; and
   a complementary-metal-oxide-semiconductor (CMOS) circuit comprising a sample and hold circuit and an analog-to-digital circuit (ADC) in the silicon substrate, wherein the CMOS circuit is arranged to detect electrical current generated at the Schottky diode.

2. The surface-plasmon based photodetector of claim 1, wherein the grating is aluminum.

3. The surface-plasmon based photodetector of claim 1, wherein the grating is tungsten.

4. The surface-plasmon based photodetector of claim 1, wherein the grating is platinum.

5. The surface-plasmon based photodetector of claim 1, wherein the grating is gold.

6. The surface-plasmon based photodetector of claim 1, wherein the grating comprises a plurality of rings.

7. The surface-plasmon based photodetector of claim 1, wherein the grating comprises a plurality of pillars arranged in a two-dimensional array.

8. The surface-plasmon based photodetector of claim 1, wherein the CMOS circuit is laterally displaced from the grating without being positioned directly underneath the grating.

9. The surface-plasmon based photodetector of claim 1, wherein the CMOS circuit is no more than 1 micron away from an edge of the grating.

10. The surface-plasmon based photodetector of claim 1, wherein the ADC comprises a sigma-delta A-to-D converter.

11. The surface-plasmon based photodetector of claim 1, wherein the sample and hold circuit comprises a differential amplifier circuit.

12. The surface-plasmon based photodetector of claim 11, wherein the differential amplifier circuit comprises multiple differential stages.

* * * * *